United States Patent
Yoshimura et al.

(10) Patent No.: US 8,669,481 B2
(45) Date of Patent: Mar. 11, 2014

(54) LAMINATED CIRCUIT BOARD AND BOARD PRODUCING METHOD

(75) Inventors: Hideaki Yoshimura, Kawasaki (JP); Asami Hondo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 101 days.

(21) Appl. No.: 13/074,442

(22) Filed: Mar. 29, 2011

(65) Prior Publication Data

US 2011/0303453 A1    Dec. 15, 2011

(30) Foreign Application Priority Data

Jun. 9, 2010    (JP) .................................. 2010-132394

(51) Int. Cl.
*H05K 1/11*    (2006.01)
(52) U.S. Cl.
USPC ........... 174/264; 174/250; 174/255; 174/257; 174/260; 174/261
(58) Field of Classification Search
USPC ................. 174/264, 250, 255, 257, 260, 261
See application file for complete search history.

(56) References Cited

U.S. PATENT DOCUMENTS

| | | | |
|---|---|---|---|
| 6,326,555 B1* | 12/2001 | McCormack et al. | 174/255 |
| 6,706,973 B2* | 3/2004 | DiStefano et al. | 174/260 |
| 6,742,247 B2* | 6/2004 | Pai et al. | 174/255 |
| 7,547,577 B2* | 6/2009 | Card et al. | 438/108 |
| 7,943,001 B2 | 5/2011 | Nakagawa et al. | |

FOREIGN PATENT DOCUMENTS

| | | |
|---|---|---|
| CN | 1722940 A | 1/2006 |
| CN | 101090610 A | 12/2007 |
| CN | 101707854 A | 5/2010 |
| EP | 0 572 232 A2 | 12/1993 |
| JP | 3826651 B2 | 7/2006 |
| JP | 2006210766 A | 8/2006 |
| JP | 2006303245 A | 11/2006 |

OTHER PUBLICATIONS

Office Action issued on May 6, 2013 in corresponding CN Patent Application No. 201110077752.4 with English translation.
2nd Notification of Office Action dated Nov. 27, 2013 corresponding to Chinese Patent Application No. 201110077752.4 and English translation thereof.

* cited by examiner

*Primary Examiner* — Hoa C Nguyen
*Assistant Examiner* — Paresh Paghadal
(74) *Attorney, Agent, or Firm* — Squire Sanders (US) LLP

(57) ABSTRACT

A laminated circuit board includes a first wiring board that has a first land formed on a surface thereof; a second wiring board that has a second land formed on a surface thereof; a bonding layer that is laid between the first wiring board and the second wiring board and electrically connects the first land and the second land via a conducting material; and a plate that has a through-hole through which the first land is connected to the second land, wherein a diameter of the through-hole of the plate is larger than a diameter of a component that is made by filling the conducting material.

3 Claims, 7 Drawing Sheets

LAMINATED CIRCUIT BOARD AND BOARD PRODUCING METHOD

CROSS-REFERENCE TO RELATED APPLICATION

This application is based upon and claims the benefit of priority of the prior Japanese Patent Application No. 2010-132394, filed on Jun. 9, 2010, the entire contents of which are incorporated herein by reference.

FIELD

The embodiments discussed herein are directed to a laminated circuit board and a board producing method.

BACKGROUND

Well-known build-up processes for producing a multi-layered printed circuit board include an additive process and a semi-additive process in which a conductor pattern is formed on an insulating plate. The above board producing methods use, as the number of layers increases, in order to decrease the processing steps and prevent a noticeable decrease in the yield ratio, a laminating technique of bonding separately produced board layers together with a conducting material or the like in one process.

How a conducting material is supplied and how board layers are stacked up are described with reference to FIG. 6. More particularly, as illustrated in FIG. 6, the conducting material is supplied to a through-hole that is formed on a bonding layer (see (1) of FIG. 6), and then pressure and heat are applied to a plurality of boards, thereby producing a laminated board (see (2) of FIG. 6).

It is noted that an enough amount of the conducting material is supplied to the through-hole of the bonding layer such that, even if the boards that are layers of the laminated board are curved or bumpy, joint lands of the boards are connected to each other. In other words, the conducting material is supplied to the through-hole of the bonding layer with an amount enough even for a position where concave portions of the surfaces of the boards face to each other, and the bonding layer is configured to be thick enough to cancel out any curve and bumpiness on the surfaces of the boards.

Patent Document 1: Japanese Laid-open Patent Publication No. 2006-210766

Patent Document 2: Japanese Laid-open Patent Publication No. 2006-303245

However, since the above conducting-material supplying technique needs to supply a large amount of the conducting material to the through-hole of the bonding layer, it brings a problem in that an excess conducting material flows onto the interface of the bonding layer and this decreases both the isolation performance and the bonding reliability.

Because the bonding layer is thick enough to cancel out any curve and bumpiness on the surfaces of the boards, if there is a position where convex portions of the surfaces of the boards face to each other, the gap between the bonding layers at this position is small. If so, as illustrated in FIG. 7, for example, the excess conducting material flows onto the interface of the bonding layer, which decreases both the isolation performance of the bonding layer and the bonding reliability.

SUMMARY

According to an aspect of an embodiment of the invention, a laminated circuit board includes a first wiring board that has a first land formed on a surface thereof; a second wiring board that has a second land formed on a surface thereof; a bonding layer that is laid between the first wiring board and the second wiring board and electrically connects the first land and the second land via a conducting material; and a plate that has a through-hole through which the first land is connected to the second land, wherein a diameter of the through-hole of the plate is larger than a diameter of a component that is made by filling the conducting material.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

[a] First Embodiment

In the following, the configuration of the laminated circuit board according to the first embodiment, then the method of producing the laminated circuit board, and finally the effects of the first embodiment are described.

Configuration of the Laminated Circuit Board

Figure 1:
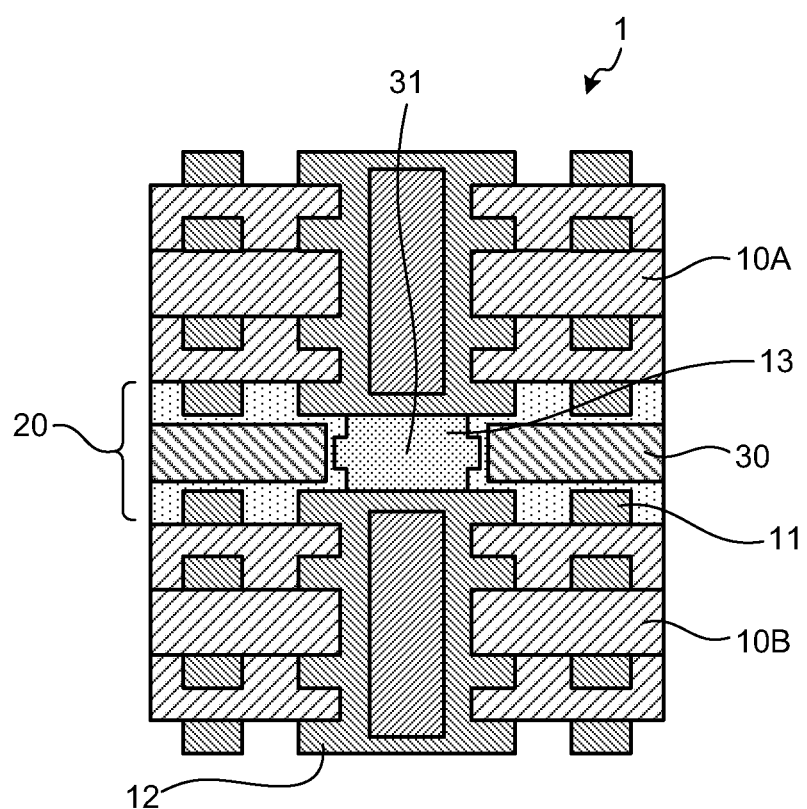
FIG. 1 is a block diagram of the configuration of a laminated circuit board according to the first embodiment.

The configuration of a laminated circuit board 1 is described below with reference to FIG. 1. FIG. 1 is a block diagram of the configuration of the laminated circuit board 1 according to the first embodiment. As illustrated in FIG. 1, the laminated circuit board 1 includes a board 10A, a board 10B, wiring patterns 11, joint lands 12, a conducting material 13, a bonding layer 20, plates 30, and through-holes 31.

The laminated circuit board 1 is a multi-layered printed wiring board in which the joint lands 12 of the board 10A and the board 10B are connected to each other via the conducting material 13 and the two or more wiring patterns 11 are electrically connected to each other. The laminated circuit board 1 further includes the plate 30 between the board 10A and the board 10B, the plate 30 having the through-holes 31 into which the conducting material 13 is supplied.

The board 10A has the wiring patterns 11 printed thereon and the joint lands 12 formed on the surface thereof. Moreover, the joint lands 12 of the board 10A are connected to the respective joint lands 12 of the board 10B via the conducting material 13 and the wiring patterns 11 are electrically connected to each other.

The board 10B also has the wiring patterns 11 printed thereon and the joint lands 12 formed on the surface thereof. The joint lands 12 thereof are connected to the respective joint lands 12 of the board 10A via the conducting material 13 and the wiring patterns 11 are electrically connected to each other.

The bonding layer 20 is laid between the board 10A and the board 10B and electrically connects the joint lands 12 of the board 10A and the joint lands 12 of the board 10B via the conducting material 13. More particularly, the bonding layer 20 is laid on bonding surfaces of the two boards 10A and 10B on which bonding resin is stacked in such a manner that the bonding layer 20 covers the joint lands 12 and the wiring patterns 11.

As is described later with reference to FIG. 2, before the bonding layer 20 is laid between the board 10A and the board 10B, mylar films 21 are bonded to the both surfaces the bonding layer 20, respectively and through-holes 22 are formed on the bonding layer 20 to accommodate the conducting material 13. The bonding layer 20 is, for example, a used bonding layer having a thickness 70 μm made of a thermosetting epoxy bonding resin. The mylar films 21 made of a polyethylene terephthalate (PET) resin are bonded to the front and rear surfaces thereof, respectively and the through-holes 22 having φ200 μm are formed at positions that correspond to the joint lands. After that, the mylar film 21 of either surface is removed and then the bonding layer 20 is bonded to a target position of the board.

The plate 30 has the through-holes 31 at respective positions where the conducting material 13 is formed. The diameter of the through-holes 31 is larger than the diameter of components that are made by filling the conducting material 13. Moreover, the plate 30 can be made of a material used in a widely-used printed board. With this configuration, the properties and the reliability of the board are satisfied.

The plate 30 is, for example, made from an epoxy base material (prepreg) of a printed board. As a plate producing manner, the base material is produced by chemically etching a copper foil of a resin copper-covered plate that is produced by bonding copper foils to the front and rear surfaces of prepreg and then pressing the prepreg. It is noted that the present invention is not limited to the above means and the above material and it is allowable to use, for example, an organic film, such as a polyimide film, an inorganic plate, such as a ceramic plate, and even a metallic plate if the plate is subjected to insulating treatment after through-holes are formed thereon.

The diameter of the through-holes 31 of the plate 30 is larger than the diameter of the components that are made by filling the conducting material. For example, the through-holes 31 with φ300 μm are formed on the plate 30 having a thickness 100 μm by using a drill at positions where the conducting material 13 is formed.

Method of Producing the Laminated Circuit Board

The method of producing the laminated circuit board 1 is described below with reference to FIGS. 2 and 3 according to the first embodiment. FIG. 2 is a schematic diagram that illustrates the method of producing the laminated circuit board 1 according to the first embodiment. FIG. 3 is a schematic diagram that illustrates the method of stacking layers of the laminated circuit board 1 according to the first embodiment.

First, the two boards 10A and 10B are prepared; their joint lands 12 will be electrically connected to each other. As illustrated in FIG. 2, the bonding layer 20 with the mylar films 21 bonded to both surfaces thereof is also prepared (see (1) of FIG. 2). Then, the through-holes 22 are formed at positions on the bonding layer 20 that correspond to the respective joint lands 12 to accommodate the conducting material 13 that is used to connect the joint lands 12 to each other (see (2) of FIG. 2).

Subsequently, the bonding layer 20 is bonded to the bonding planes of the two boards 10A and 10B on which bonding resin is stacked in such a manner that the bonding layer 20 covers the joint lands 12 and the wiring patterns 11 (see (3) of FIG. 2). After that, by movement of a squeegee 40, a well-known conducting material is applied (printed) onto a board 10 and, thus, the through-holes 22 are filled with the conducting material 13 to connect the joint lands 12 (see (4) of FIG. 2).

Then, the two or more plates 30 are prepared. Each plate 30 has the through-holes 31 at positions that correspond to the respective joint lands 12. The diameter of the through-holes 31 is larger than the diameter of the through-holes 22 formed on the bonding layer 20. After that, the mylar film 21 is removed from the bonding layer 20 and then the position of the plate 30 is decided to a bonding plane where the boards 10A, 10B and 10C are bonded together (see (5) of FIG. 2).

Figure 2:
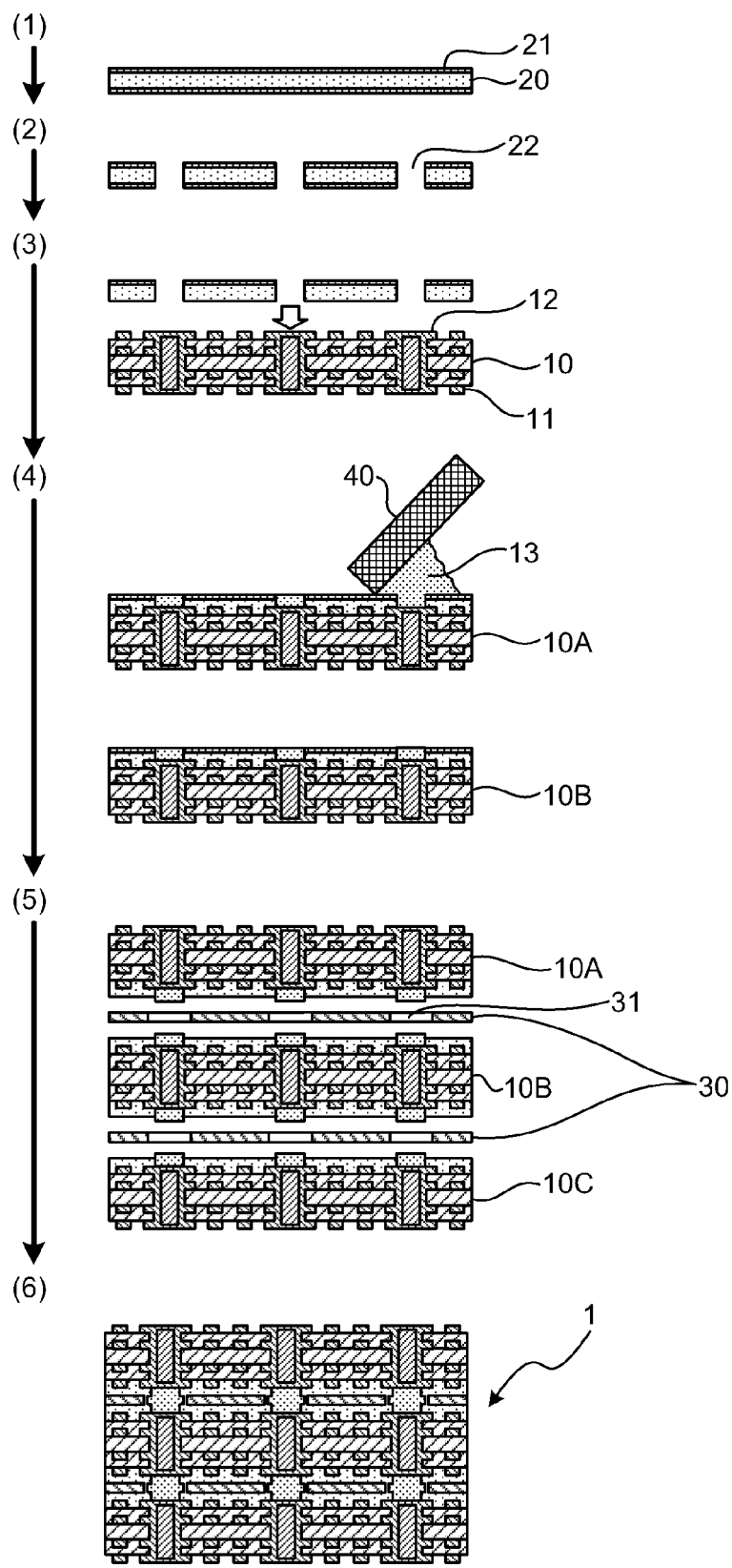
FIG. 2 is a schematic diagram that illustrates a method of producing the laminated circuit board according to the first embodiment.
Figure 3:
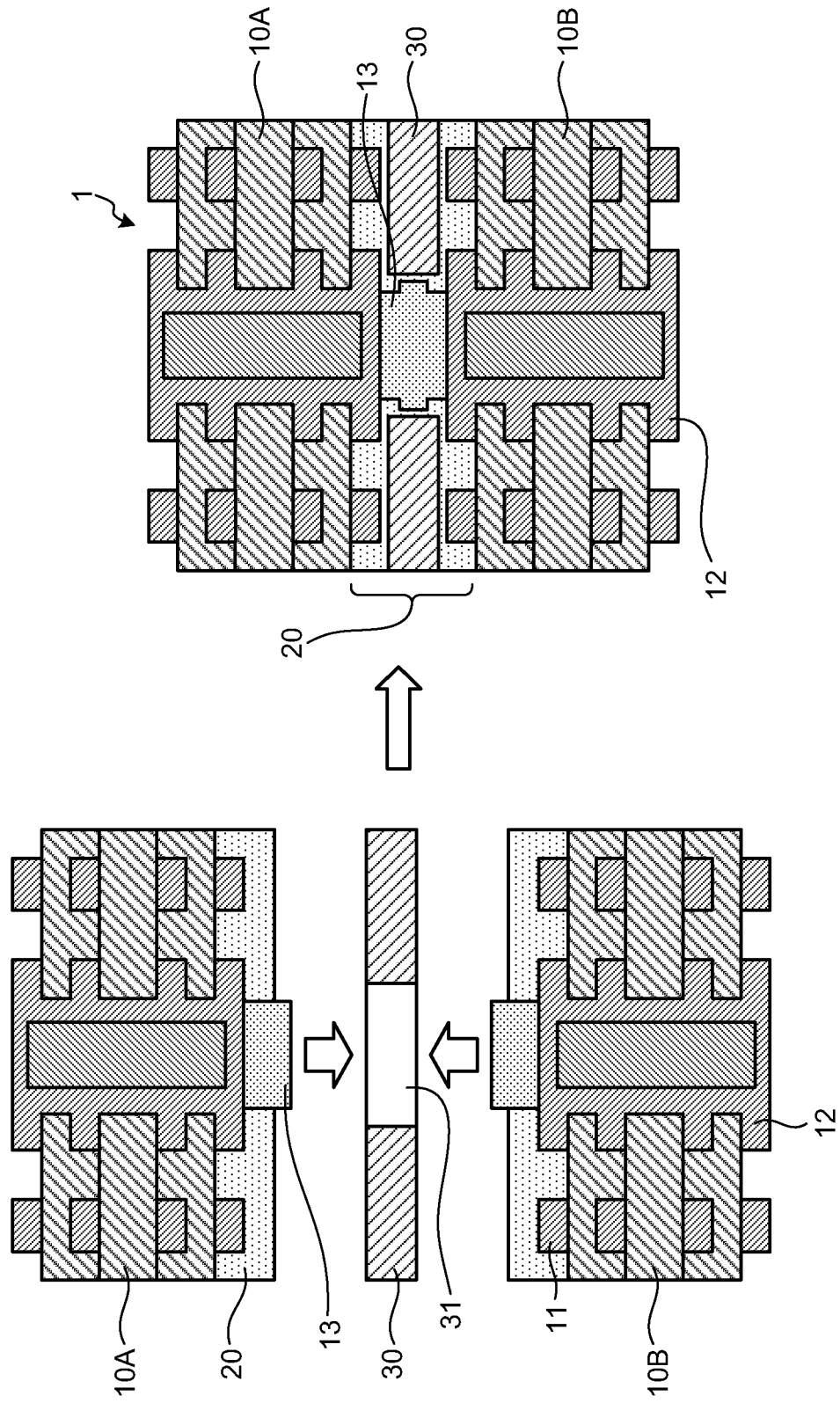
FIG. 3 is a schematic diagram that illustrates a method of stacking layers of the laminated circuit board according to the first embodiment.

Thereafter, layer stacking is performed by applying heat and pressure in vacuum, the pressure being in a direction perpendicular to the two or more plates 30 and the two position-decided boards 10A, 10B and 10C (see (6) of FIG. 2). The layer stacking method is described below in details with reference to FIG. 3. FIG. 3 is a schematic diagram that illustrates the method of stacking layers of the laminated circuit board according to the first embodiment. As illustrated in FIG. 3, the diameter of the through-holes 31 formed on the plate 30 is larger than the diameter of the components that are made by filling the conducting material 13. Therefore, after the boards 10A and 10B are stacked up, the excess conducting material 13 flows into the through-holes 31.

Figure 4:
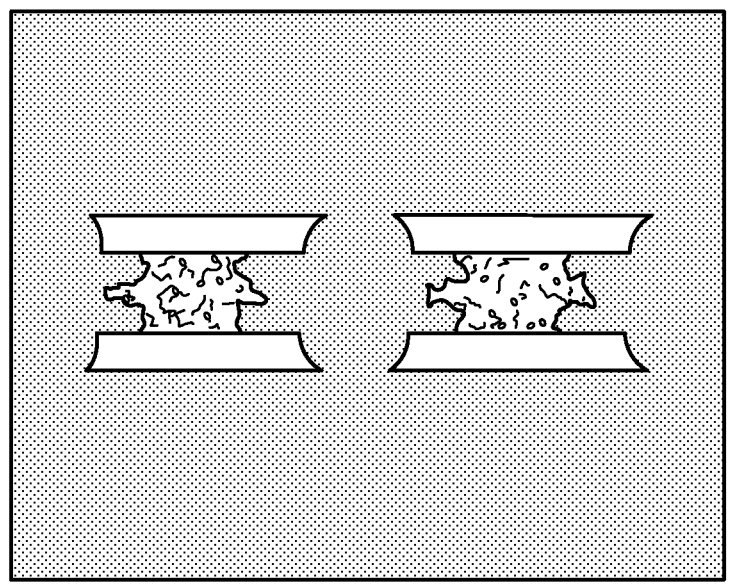
FIG. 4 is a schematic diagram that illustrates how an excess conducting material is in a through-hole of a plate.

As a result, as illustrated in FIG. 4 for example, after the boards 10A and 10B are stacked up, the through-holes 31 accommodate therein the excess conducting material 13 and, therefore, the excess conducting material 13 may not flow onto the bonding layer 20. With this configuration, the laminated circuit board 1 prevents both a decrease in the isolation performance of the bonding layer 20 and a decrease in the bonding reliability between the boards 10A and 10B.

Effects of the First Embodiment

As described above, the laminated circuit board 1 includes the boards 10A and 10B each having the joint lands 12 on the surface thereof; the bonding layer 20 that is laid between the board 10A and the board 10B and electrically contact the joint lands 12 to each other via the conducting material 13; and the plate 30 that has the through-holes 31 to accommodate the conducting material 13. The diameter of the through-holes 31 of the plate 30 is larger than the diameter of the components that are made by filling the conducting material 13. Therefore, in the laminated circuit board 1, the excess conducting material 13 cannot flow onto the bonding layer 20, which prevents both a decrease in the isolation performance of the bonding layer 20 and a decrease in the bonding reliability.

Moreover, the plate 30 of the laminated circuit board 1 has the through-holes 31 with a diameter larger than the diameter of the components that are made by filling the conducting material 13 and is large enough to accommodate the excess conducting material 13 when the joint lands 12 are connected to each other. With this configuration, the excess conducting material 13 is appropriately accommodated in the through-holes 31, which prevents both a decrease in the isolation performance of the bonding layer 20 and a decrease in the bonding reliability.

Moreover, the bonding layer 20 is formed between the bonding surfaces of the boards 10A and 10B to electrically connects the joint lands 12 of the boards 10A and 10B to each other and, the through-holes are formed on the bonding layer to accommodate the conducting material. Thereafter, the formed through-holes are filled with the conducting material and the plate 30 that has the through-holes 31 is decided to the bonding plane where the boards 10A and 10B are bonded together. The diameter of the through-holes 31 is larger than the diameter of the through-holes 22 formed on the bonding layer 20. After that, layer stacking is performed by applying heat and pressure, the pressure being in a direction perpendicular to the position-decided plate and the layers of the boards 10A and 10B. This enables producing the laminated circuit board 1, preventing the excess conducting material 13 from flowing onto the bonding layer 20.

Moreover, before the bonding layer 20 is formed on the bonding surface of the board, the through-holes 22 are formed on the bonding layer 20. The through-holes are thus formed before the bonding layer 20 is formed on the bonding surface of the board, which enables producing the laminated circuit board 1 efficiently.

[b] Second Embodiment

Although, in the first embodiment, using a member with a hole, the bonding layer that has the through-holes at positions of the lands to be connected, the present invention is not limited thereto. It is possible to form the bonding layer on the board first and then form through-holes on the bonding layer by heating and sublimating the parts.

Figure 5:
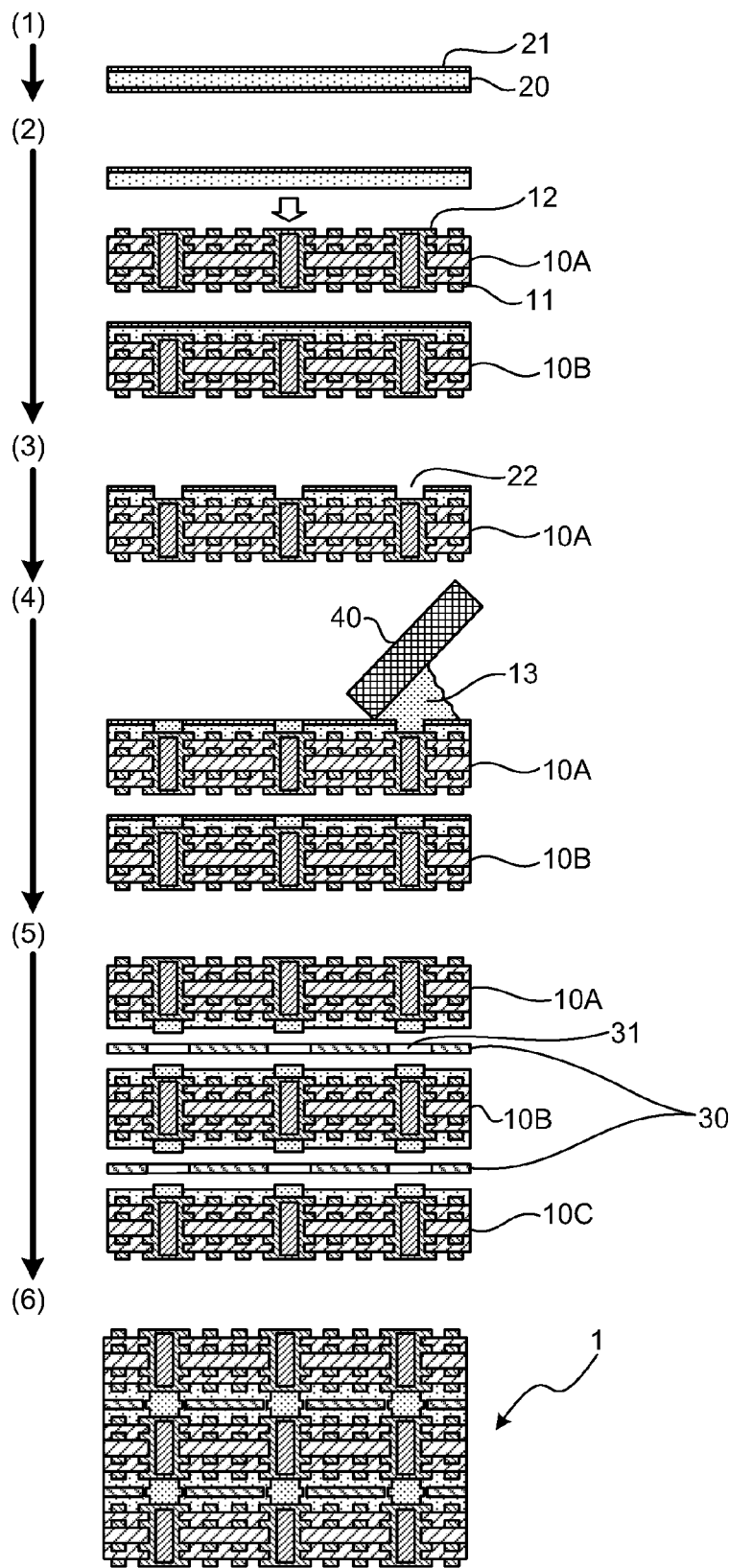
FIG. 5 is a schematic diagram that illustrates a method of producing a laminated circuit board according to the second embodiment.
Figure 6:
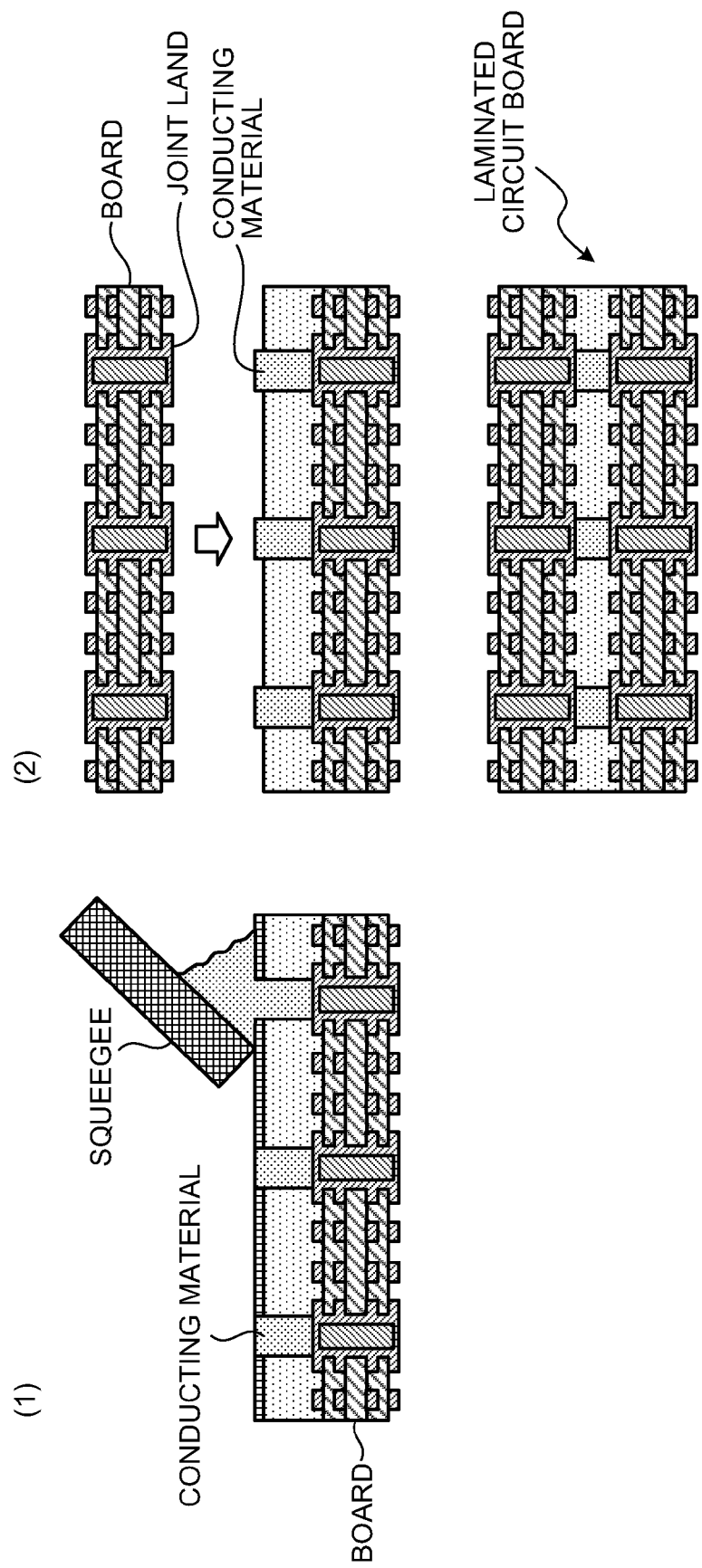
FIG. 6 is a schematic diagram that illustrates a method of supplying a conducting material into a through-hole.
Figure 7:
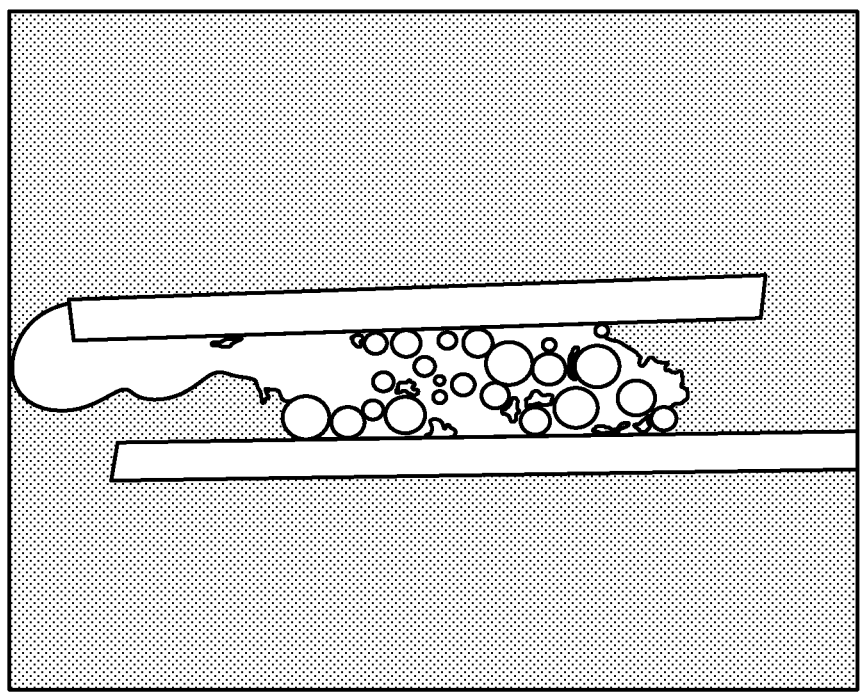
FIG. 7 is a schematic diagram that illustrates how an excess conducting material flows out.

In the second embodiment, as described below, the bonding layer is formed on the surface of the board, first, and then thresh-holds are formed on the bonding layer by heating and sublimating the parts. The method of producing the laminated circuit board is described below with reference to FIG. 5 according to the second embodiment. FIG. 5 is a schematic diagram that illustrates the method of producing the laminated circuit board according to the second embodiment.

As illustrated in FIG. 5, the bonding layer 20 with the mylar films 21 bonded to both surface thereof is prepared (see (1) of FIG. 5). Thereafter, the bonding layer 20 is bonded to the bonding surfaces of the two boards 10A and 10B on which bonding resin is stacked in such a manner that the bonding layer 20 covers the joint lands 12 and the wiring patterns 11 (see (2) of FIG. 5).

Subsequently, the through-holes 31 are formed at positions on the bonding layer 20 that correspond to the respective joint lands 12 to accommodate the conducting material 13 and then connect the joint lands 12 (see (3) of FIG. 5). For example, the through-holes are formed on the bonding layer 20 by heating and sublimating the parts using a carbon dioxide laser or the like.

After that, by movement of the squeegee 40, a well-known conducting material is applied (printed) onto the board 10 and, thus, the through-holes 31 are filled with the conducting material 13 to connect the joint lands 12 (see (4) of FIG. 5).

Thereafter, the two or more plates 30 are prepared. Each plate 30 has the through-holes 31 at positions that correspond to the respective joint lands 12. After that, the mylar film 21 is removed from the bonding layer 20 and then the position is decided between the plate 30 and the bonding plane on which the boards 10 are bonded (see (5) of FIG. 5). Thereafter, layer stacking is performed by applying heat and pressure in vacuum, the pressure being in a direction perpendicular to the two or more plates 30 and the two position-decided boards 10A and 10B (see (6) of FIG. 5).

As described above, in the second embodiment, the bonding layer 20 is formed on the bonding surface of the board, and then the through-holes 22 are formed on the bonding layer 20. As described above, the bonding layer 20 is formed on the bonding surface of the board, and then the through-holes 22 are formed on the bonding layer 20, which enables forming the through-holes 22 appropriately.

[c] Third Embodiment

The present invention is not limited to the first embodiment and the second embodiment and can be embodied variously. Other embodiments are described below as the third embodiment.

(1) Through-Hole

Any manner can be used to form the through-holes 31. It is allowable to separately process the bonding layer 20 and the plate 30 and then bond the processed bonding layer 20 and the processed plate 30 together. Moreover, it is allowable to bond the bonding layer 20 and the plate 30 together, and then process certain portions of the bonded member. Moreover, any processing method can be used. It is allowable to use a typical drill and a typical laser.

(2) Applicable Devices

In order to achieve the object, the technology disclosed herein can be used in various devices, such as large scale integrations (LSIs), interposers, mother boards, various semiconductor devices, various package boards, various relay devices, and various circuit boards.

According to an embodiment of the laminated circuit board disclosed in the subject application, an excess conducting material cannot flow onto a bonding layer, which prevents both a decrease in the isolation performance of the bonding layer and a decrease in the bonding reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A laminated circuit board comprising:
a first wiring board that has a first land formed on a surface thereof;
a second wiring board that has a second land formed on a surface thereof;
a bonding layer that is laid between the first wiring board and the second wiring board and electrically connects the first land and the second land via a conducting material and that has a first through-hole filled with the conducting material; and
a plate that has a second through-hole through which the first land is connected to the second land, wherein
a diameter of the second through-hole of the plate is larger than a diameter of the first through-hole of the bonding layer and is smaller than a diameter of each of the first and second lands.

2. The laminated circuit board according to claim 1, wherein a volume of the second through-hole is larger than an excess part of the conducting material that is obtained when the first land is connected to the second land, the excess part being a part of the conducting material filling with the first through-hole and flowing onto the bonding layer when the laminated circuit board does not comprise the plate that has the second through-hole.

3. The laminated circuit board according to claim 1, wherein the diameter of the second through-hole of the plate is 1.5 times larger than the diameter of the first through-hole of the bonding layer.

* * * * *